(12) United States Patent
Lienau

(10) Patent No.: US 6,317,354 B1
(45) Date of Patent: Nov. 13, 2001

(54) NON-VOLATILE RANDOM ACCESS FERROMAGNETIC MEMORY WITH SINGLE COLLECTOR SENSOR

(75) Inventor: Richard M. Lienau, Santa Fe, NM (US)

(73) Assignee: Pageant Technologies, Inc., Toronto (CA)

( * ) Notice: Subject to any disclaimer, the term of this patent is extended or adjusted under 35 U.S.C. 154(b) by 0 days.

(21) Appl. No.: 09/516,046

(22) Filed: Feb. 29, 2000

Related U.S. Application Data

(60) Provisional application No. 60/122,731, filed on Mar. 4, 1999, provisional application No. 60/122,733, filed on Mar. 4, 1999, provisional application No. 60/121,901, filed on Mar. 4, 1999, provisional application No. 60/121,925, filed on Mar. 4, 1999, and provisional application No. 60/122,822, filed on Mar. 4, 1999.

(51) Int. Cl.$^7$ .................................................. G11C 11/22
(52) U.S. Cl. .............................. 365/145; 365/9; 365/170; 257/427
(58) Field of Search .............................. 365/9, 145, 170; 257/421, 427

(56) References Cited

U.S. PATENT DOCUMENTS

| | | | |
|---|---|---|---|
| 3,048,829 | 8/1962 | Bradley | 340/174 |
| 3,223,985 | 12/1965 | Bittmann et al. | 365/61 |
| 3,418,645 | 12/1968 | Fussell | 365/61 |
| 3,466,634 | 9/1969 | Gamblin | 340/174 |
| 3,613,013 | 10/1971 | Vallese | 328/34 |
| 3,714,523 | 1/1973 | Bate | 317/235 R |
| 3,727,199 | 4/1973 | Lekven | 365/172 |
| 4,283,643 | 8/1981 | Levin | 327/511 |
| 4,360,899 | 11/1982 | Dimyan | 365/171 |
| 4,607,271 | 8/1986 | Popovic et al. | 357/27 |
| 4,791,604 | 12/1988 | Lienau | 365/9 |
| 4,803,658 | 2/1989 | Grimes | 365/87 |
| 4,831,427 | 5/1989 | Coleman | 357/27 |
| 4,887,236 | 12/1989 | Schloemann | 365/173 |
| 5,068,826 | 11/1991 | Matthews | 365/170 |
| 5,075,247 | 12/1991 | Matthews | 437/52 |
| 5,089,991 | 2/1992 | Matthews | 365/9 |
| 5,107,460 | 4/1992 | Matthews | 365/122 |
| 5,208,477 | 5/1993 | Kub | 257/421 |
| 5,289,410 | 2/1994 | Katti et al. | 365/170 |
| 5,295,097 | 3/1994 | Lienau | 365/170 |
| 5,329,480 | 7/1994 | Wu et al. | 365/170 |
| 5,396,455 | * 3/1995 | Brady et al. | 365/170 |
| 5,926,414 | 7/1999 | McDowell et al. | 365/170 |

* cited by examiner

Primary Examiner—Son Mai
(74) Attorney, Agent, or Firm—Jones, Waldo, Holbrook & McDonough; Michael W. Starkweather; Brent T. Winder

(57) ABSTRACT

A non-volatile RAM device is disclosed which utilizes a plurality of ferromagnetic bits (6) each surrounded by a coil of a write line (13) for directing the remnant polarity thereof is disclosed. The direction of magnetic remnance in each bit (6) is dictated by the direction of a current induced into write line (13). Further, a magneto sensor (7) comprising a magneto resistor (1) coupled to a collector (2) is placed approximate each bit (6). The magneto resistor (1) is coupled to a control circuit (30) for receiving current. The current passing across magneto resistor (1) is biased in a direction either right or left of the original current flow direction. The collector is coupled to a sense line (4), which in turn, is coupled to an amplifier (12). When current flow is biased in the direction of the collector, the serial resistance of the magneto resistor will be decreased, and the sense line (4) will receive a high amount of current. However, when current flow is biased in the direction away from the collector, then the serial resistance of the magneto resistor will be effectively increased, and the sense line (4) will receive a small amount of current. The presence and amount of current in the sense line (4) is amplified and detected by the amplifier (12).

15 Claims, 4 Drawing Sheets

NON-VOLATILE RANDOM ACCESS FERROMAGNETIC MEMORY WITH SINGLE COLLECTOR SENSOR

PRIORITY OF THE INVENTION

This application claims priority to co-pending U.S. Provisional Application No. 60/122,731, filed Mar. 4, 1999.

RELATED PATENT APPLICATIONS

The following provisional patent applications are related to the present invention:

Serial No. 60/122,733
Serial No. 60/121,901
Serial No. 60/121,925
Serial No. 60/122,822

THE FIELD OF THE INVENTION

The present invention relates to non-volatile random access memory. More particularly, the present invention relates to a magneto resistor sensor with a single collector for a non-volatile random access ferromagnetic memory.

BACKGROUND OF THE INVENTION

Computer memory technology has experienced profound advances in the last two decades. One of the first computer memories involved magnetic core memory technology. To form each magnetic core, a miniature toroidal-shaped ferrite core was interwoven into a fine matrix of wires. By applying a current through the wires, the core would be programmed with either a north or south directed flux path that would correspond to a logic one or zero. The advantage of magnetic core memory is that it is non-volatile, or does not need to be refreshed to remember the stored logic signal. Additionally, Core memory is also "radiation-hard" or unaffected by ionizing radiation like gamma rays. However, the assembly of the magnetic core was very labor intensive and was quickly abandoned when semiconductor processes were developed.

Currently one of the most popular memory technologies uses either a form of MOS (metal-oxide-semiconductor) or CMOS (complementary metal-oxide-semiconductor) processes. However, it is well known that this technology requires constant refreshing of each memory cell to maintain the logic signal strength due to the inherent leakage of capacitors. This constant refreshing of the memory cells is not a problem when there is an unlimited voltage source, but in many applications, like laptop computers and cell phones, there is a finite supply. To deal with this problem, rechargeable batteries have been used in all portable electrical devices.

The problem with using devices that have capacitive memory arrays is the inconvenience in keeping the batteries properly charged every few hours. Therefore, there is a need for a nonvolatile memory device that does not need to be refreshed and is inexpensive and quick to make.

Examples of patents related to non-volatile RAM, each of which are herein incorporated by reference for their supporting teachings, are as follows:

U.S. Pat. No. 4,360,899 to Dimyan et al. teaches a non-volatile random access memory having a plurality of magnetic cells arranged in an array on a major surface of a substrate. In operation, a single magnetic cell is selected and inductively switched between opposite remanent, (i.e. permanent) states, upon the simultaneous application of electrical pulses to a pair of conductors intersecting adjacent the selected cell. Each electrical pulse has an amplitude which is insufficient to inductively switch the remanent state of the selected cell. However, the combined amplitude of the electrical pulses is at least equal to the amplitude required for such a switch.

U.S. Pat. No. 5,068,826 to Mathews teaches a non-volatile, static magnetic memory device, whose operation is based on the Hall effect. The device includes a magnetic patch which stores data in the form of a magnetic field, a semiconductor Hall bar, and a pair of integrally-formed bipolar transistors which are used for amplifying and buffering the Hall voltage produced along the Hall bar. In use, current is forced to flow down the length of the Hall bar causing a Hall voltage to be developed in a direction transverse to the direction of both the magnetic field and the current. The bases of the bipolar transistors are ohmically coupled to the Hall bar to sense the Hall voltage—the polarity of which is representative of the stored information. Finally, a system of current carrying conductors is employed for writing data to individual magnetic patches.

U.S. Pat. No. 5,295,097 to Lienau teaches a nonvolatile random access memory having a substrate that carries separate magnetically polarizable domains. Each domain is surrounded by a full write loop member, and arranged to penetrate a Hall channel of a dual drain FET with its residual magnetic field. The domains are organized in word rows and bit columns, are each written to by a single full write current through the surrounding loop member, and each read by a comparator connected to the FET drains. Independent separate write lines and read lines are used in writing and reading the values of each magnetic bit.

U.S. Pat. No. 4,791,604 to Lienau et al. teaches a sheet random access memory (SHRAM). The SHRAM is a non-volatile and transportable memory characterized by its cell density and relatively small size and power requirements, but having the nonvolatile character and rugged transportability of core memory, or magnetic disks or tape. The SHRAM is further characterized by a memory comprising a two dimensional magnetic substrate and a fixed driving device for writing and reading into the substrate. Further, a fixed sensing device for sensing the information is attached at each cell location. The memory media includes not only a homogeneous two dimensional substrate, but also ferrite cores formed into the substrate by photolithographic techniques, wherein the information is stored within the core and read by the sensing device from a gap defined by the core. Memory cells according to the invention can thus be arranged and organized to form destructive readout RAMs, or nondestructive readout Rams in both serial and parallel form.

U.S. Pat. No. 5,926,414 to McDowell et al. teaches a magnetic integrated circuit structure in combination with a carrier-deflection-type magnetic field sensor. Each of a variety of magnet structures realize a condition in which the magnetic field is substantially orthogonal to the direction of travel of carriers of a sense current, thereby achieving maximum sensitivity. By basing a magnetic memory cell on a single minium size MOS device, a small cell may be realized that compares favorably with a conventional DRAM of FLASH memory cell. The greater degree of control over the magnetic field afforded by the magnetic structures enables the cross-coupling between cells in a memory array to be minimized.

U.S. Pat. No. 3,727,199 to Lekven teaches a magnet memory element and a process for producing such elements in plurality to constitute a static magnetic memory or digital information storage system. Individual binary storage members are afforded directionally preferential magnetic characteristics by flux circuits to establish the preferred axis of magnetization. Conductors for driving the individual binary storage members (for storing and sensing) are provided in an organized pattern to accomplish selectivity. A batch production process is also disclosed.

SUMMARY OF THE INVENTION

It is therefore a feature of the present invention to provide a nonvolatile ferromagnetic RAM device that is capable of reading the data stored in each memory cell quickly and efficiently utilizing a minimal number of components. Specifically, there is a nonvolatile ferromagnetic RAM that is capable of reading the data stored in each magnetic bit.

Additionally, a feature of the invention is to provide a ferromagnetic memory cell, comprising a bit (6), made of a ferromagnetic material, having a remnant polarity. There is also a write line (13), located proximate the bit, coupled to receive a current sufficient to dictate the remnant polarity of the bit (6). Further, there is a magneto sensor (7) that has a magneto resistor (1) positioned proximate the bit (6), having a current flow direction responsive to the remnant polarity of the bit (6). The magneto resistor (1) is coupled to an input line (3a) for providing current to the magneto resistor (1) and a single output line (3b) for receiving current from the magneto resistor. A single collector (2) is attached along a side of the magneto resistor (1) between the input and output lines, and is also attached to the out put line (3b). In use, the collector (2) receives current from the magneto resistor (1), and conducts it into the output line (3b). The collector (2) may take different positions or configurations depending on the shape of the magneto resistor (1). For example, collector (2) may extend longitudinally along one edge of magneto resistor (1) in a direction parallel to an unbiased current flow across magneto resistor (1). Additionally, the input and output lines may be coupled to the magneto resistor (1) in different respective locations such as at opposite ends of the magneto resistor (1).

Another feature of the invention is to provide a memory cell with a control circuit (30) coupled to the magneto resistor (1) and to write line (13). The control circuit is activated during both read and write functions and is made up of a read/write drive circuit (11) and a read/write switch (9). When a selected read/write switch is activated, write functions are accomplished by the simultaneous activation of the read/write drive circuit (11), and a write drive circuit (31), and read functions are accomplished by the simultaneous activation of the write drive circuit (11) and an amplifier (12).

Yet, an additional feature of the invention is to provide a memory cell with an amplifier (12), for amplifying and detecting the presence and amount of current received from the sense line (4). The sense line (4) receives current from the output line (3b) and conducts it to the amplifier (12).

There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

It is noted that the drawings of the invention are not so scale. The drawings are merely schematic representations, not intended to portray specific parameters of the invention. The drawings are intended to depict only selected embodiments of the invention, and therefore should not be considered a limiting the scope of the invention. The invention will be described with additional specificity and detail through the use of the accompanying drawings. Like numbering between figures represent like elements.

DETAILED DESCRIPTION OF THE PREFERRED EMBODIMENT

The applicant has discovered that the reading of binary data stored within a ferromagnetic bit may be accomplished easily and efficiently using a magneto sensor in intimate communication therewith. Such a device requires no moving parts or refreshing of stored logic signals, and is capable of sensing magnetically stored data at the micron and submicron levels.

It must be noted that as used herein, the phrase "Lienau cell" means control circuitry connected to write circuitry and to read circuitry which work in connection with a ferromagnetic bit having a length which is vertically oriented with respect to a substrate. A portion of the write circuitry is located proximate the ferromagnetic bit, and dictates the direction of polarity or magnetic flux. The read circuitry may include a magneto sensor which is disposed proximate to the ferromagnetic bit and reads the polarity or the direction of the magnetic flux flow.

Figure 2:
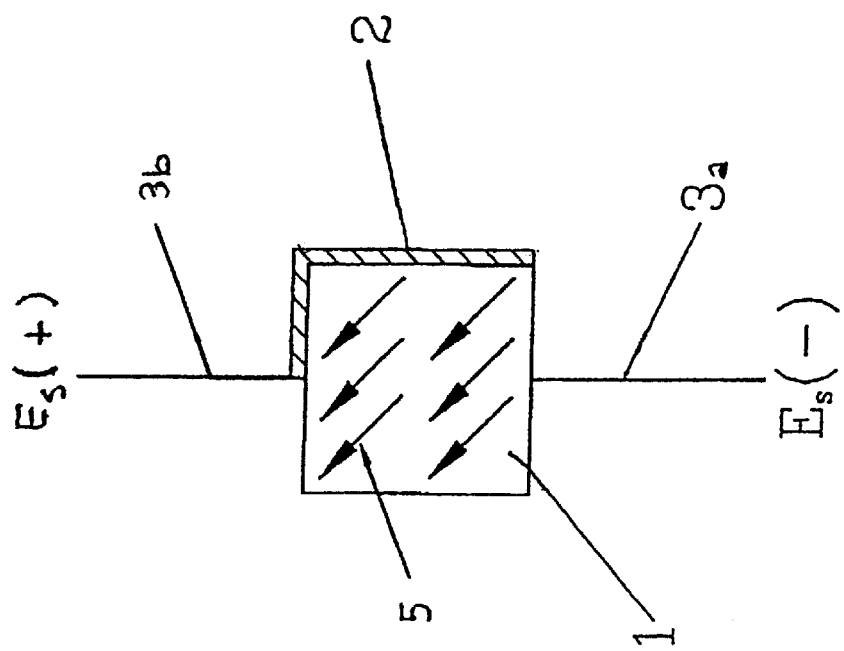
FIG. 2 is a schematic view of a magneto sensor of the present invention with a current flow direction biased to the left.
Figure 1:
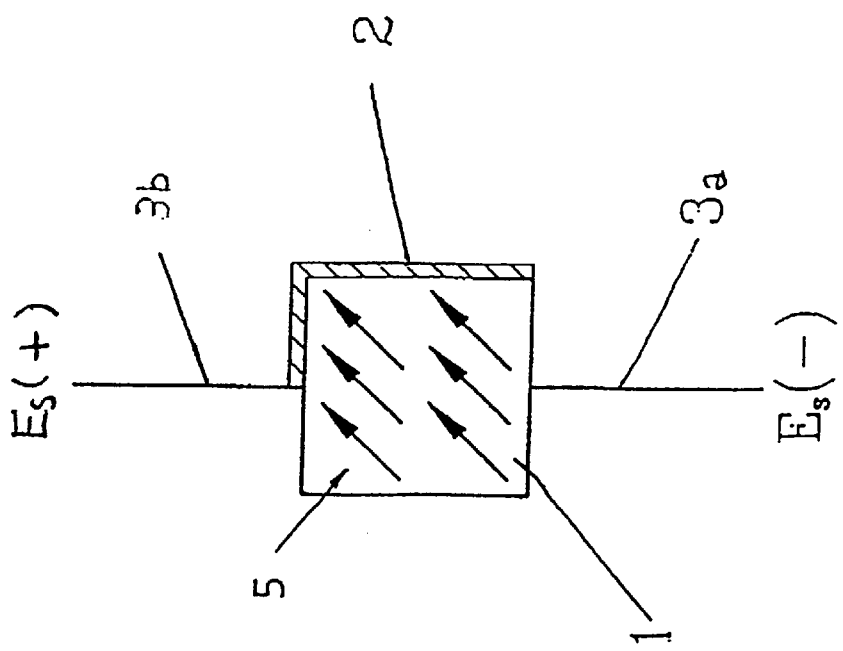
FIG. 1 is a schematic view of a magneto sensor of the present invention with a current flow direction biased to the right.

Referring now to FIGS. 1 and 2, there is shown the magneto sensor 7 of the present invention having magneto resistor 1 (referred to as MR1) with a collector 2 disposed along a selected edge of magneto resistor 1. Additionally, input line 3a provides current to MR1, and output line 3b receives current from MR1. Collector 2 is coupled to output line 3b in order to conduct the current it receives into output line 3b. (thus, effectively increasing the size of output line 3b). The current received from input line 3a, is biased in a selected direction, either left or right, as indicated by flow arrows 5. The biasing of current flows across MR1 occurs because MR1 is positioned proximate a magnetic bit (not shown) that has its flux field extending normal through MR1, i.e. extending from below sensor 7 and extending up and through the page.

In the case of FIG. 1, the current is biased to the right due to the remnance of the magnetic field being exerted on MR1. Therefore, the electrons of MR1 are crowded toward the right, causing the majority of them to collect near collector 2. Because collector 2 is positioned near the electron collection, the current passes easily into collector 2, thus the serial resistance of MR1 is effectively reduced or lowered. The opposite biasing process is illustrated by FIG. 2. In this case, electrons are biased to the left by the magnetic field, as indicated by arrows 5. However, since collector 2 is on the right side of MR1, current is directed away from collector 2.

Therefore, it is more difficult for current to flow toward collector 2, thus the serial resistance of MR1 is effectively increased.

Figure 3:
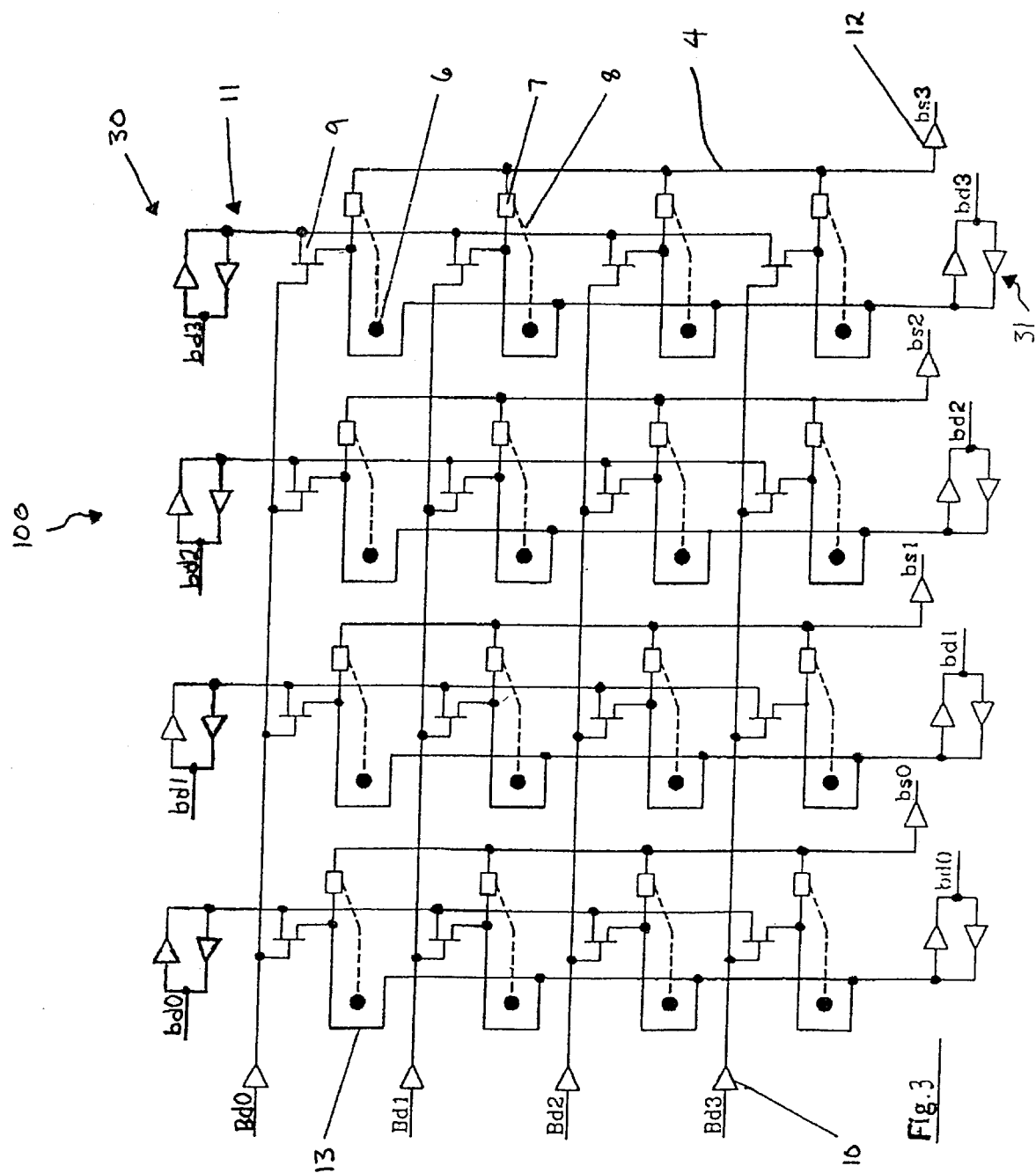
FIG. 3 is a schematic diagram of the nonvolatile random access ferromagnetic memory of the present invention.

Current flowing into collector 2 flows into output line 3b. Output line 3b is coupled to sense line 4 as shown in FIG. 3. When current is biased toward collector 2, lowering the serial resistance a larger current reaches output line 3b, and sense line 4. However, when current is biased away from collector 2, raising the serial resistance, then a much smaller amount of current flows into collector 2, through output line 3b, and into sense line 4. Thus, the magnetic remnence of the bit can be determined by the amount of current in sense line 4.

Referring now to FIG. 3, there is shown a partial schematic of a four by four random access memory matrix 100 of the present invention. A plurality of individual ferromagnetic bits 6 are each surrounded by a coil, also referred to as write or drive line 13. Magneto resistor sensor 7, comprising MR1, with collector 2 disposed thereon are placed proximate to storage bit 6. Input line 3a, and output line 3b are attached thereto. The magnetic field produced bit 6, which effects magneto sensor 7, is represented by dashed line 8. It is noted that bit 6 is really located right under or on top of sensor 7, but is best illustrated schematically with dash line 8. Control circuit 30 comprises read/write drive circuit 11, read/write switch 9 (in the form of an FET), and input amplifier 10. Control 30 is coupled to write line 13, and to magneto sensor 7. This dual coupling allows control 30 to be used during both set (write) and sense (read) operations. Write drive circuit 31 is also coupled to write line 13, but at the opposite end. Additionally, amplifier 12 is coupled to sense lines 4 as illustrated.*

During write operations of a single memory cell, appropriate segments of control circuit 30 and write drive circuit 31 are activated simultaneously. Thus, one skilled in the art will easily understand that current is directed in a desired direction, around any given memory cell, to set a logical "0" or a "1" into the bit.

Similarly, during read operations of a single memory cell, appropriate sections of control circuit 30 and sense amplifier 12 are simultaneously activated. Thus, one skilled in the art will easily understand how individual memory cells can be read. It is noted that by using the same control circuit 30 in combination with the read 12 and write 31 circuits, there is an overall reduction in the amount of circuitry needed to operate the memory cell.

Figure 4:
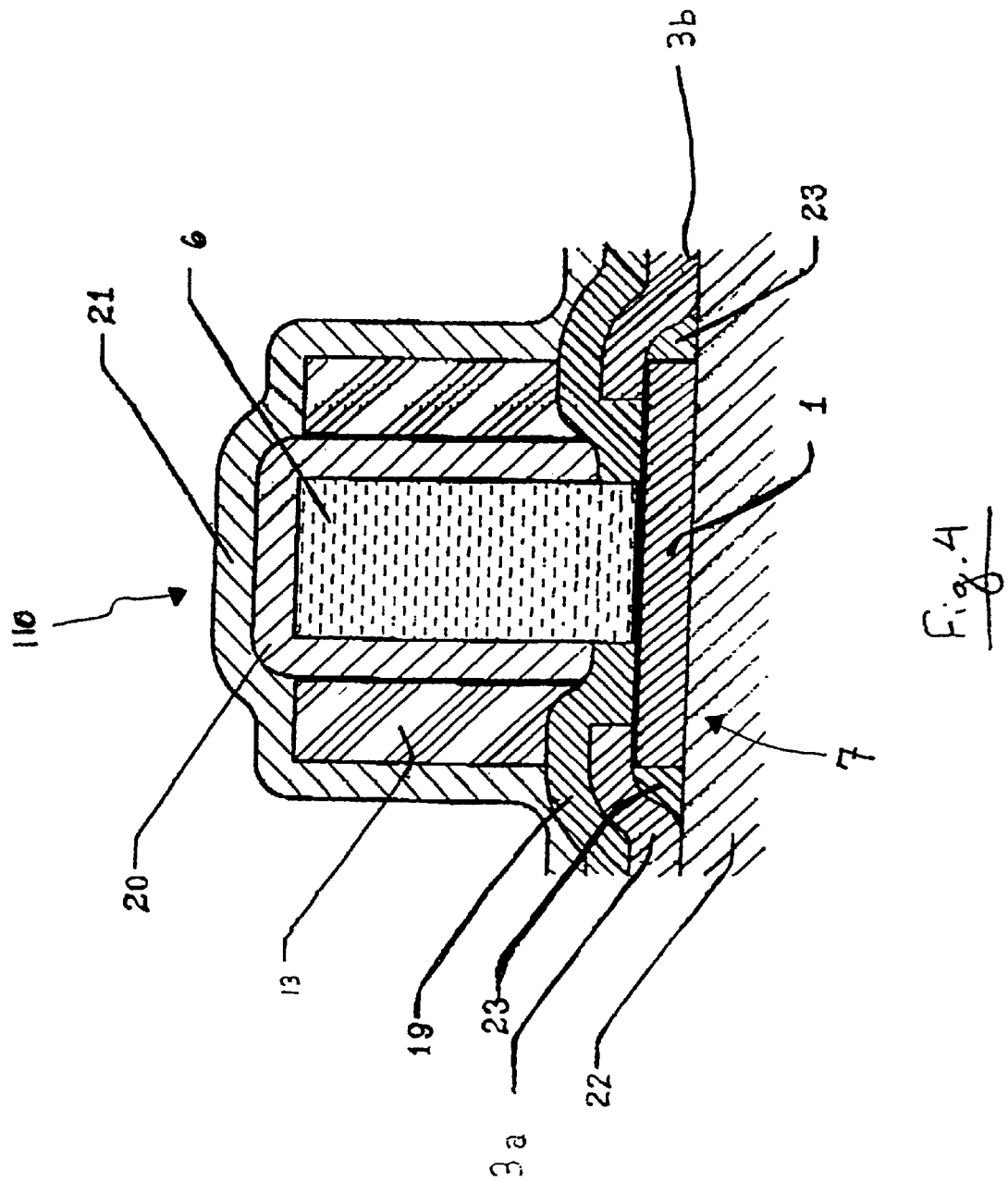
FIG. 4 is a side sectional view of the memory cell elements presented in FIG. 3, having a magneto sensor disposed below a ferromagnetic bit.
Figure 5:
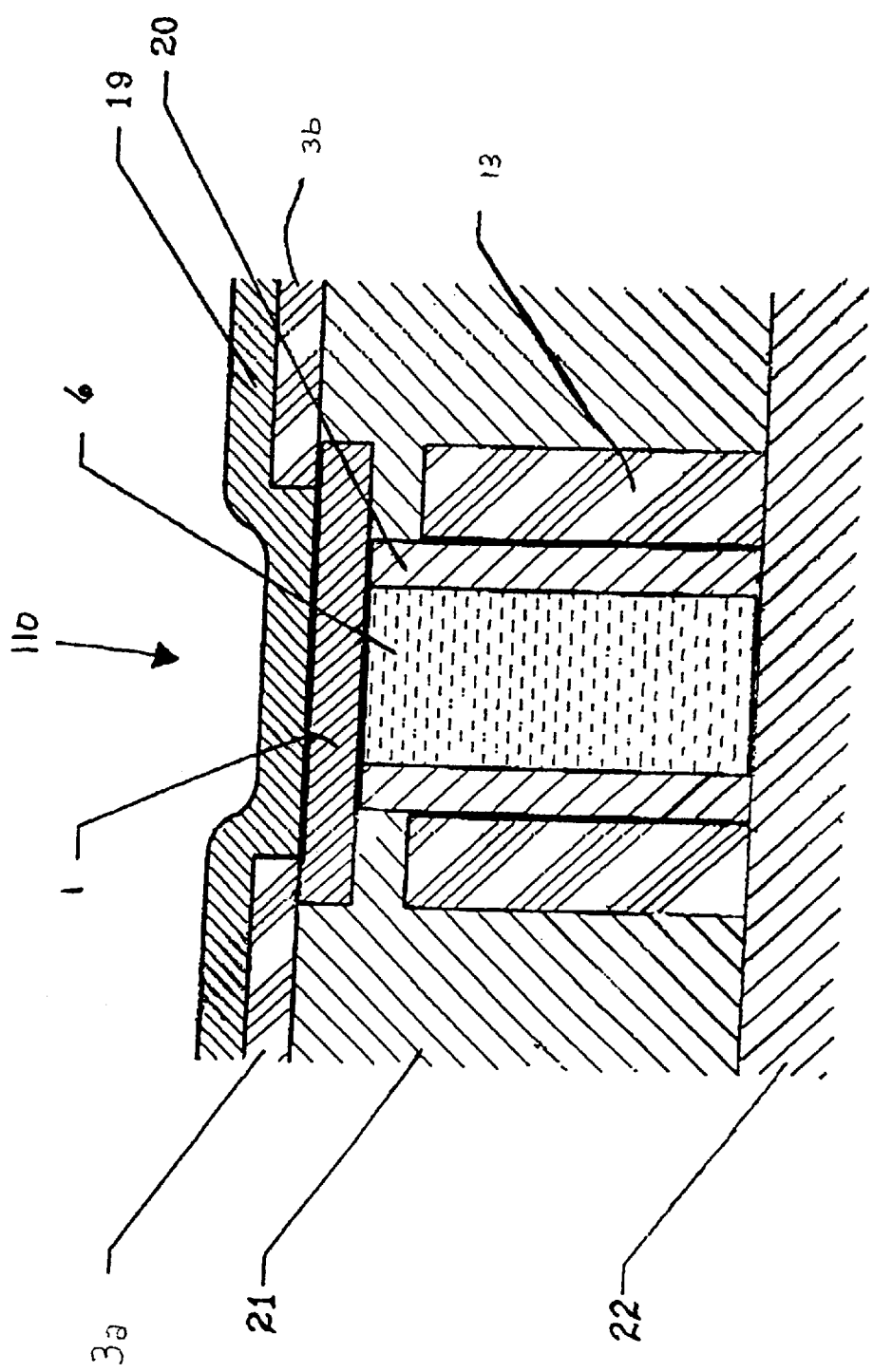
FIG. 5 is side sectional view of the memory cell elements presented in FIG. 3, having a magneto sensor disposed above a ferromagnetic bit.

Referring now to FIGS. 4 and 5, there are shown typical cross-sections of a single micron or sub-micron scale ferromagnetic memory cell element 110. Specifically, there is a magneto sensor 7. A ferromagnetic storage element, or "bit," 6, is placed upon substrate 22, and surrounded by a write line 13. Substrate 22 may be made of any well known substance for making substrates such as silicon, glass, GaAs, etc., and write line 13 may be made of any suitable conductive material known to those skilled in the art such as Al, Cu, etc. A layer of insulation 20, is disposed between write line 13, and bit 6. Further, layers 19, 21, and 23 may be made of any suitable insulative material well known in the art, such as $SiO_2$ or $Si_3N_4$, etc.

Magneto sensor 7, is placed proximate to, and may abut bit 6. Magneto sensor 7 comprises a magneto resistor 1, which is made of a high-mobility semiconductor material such as InSb, with a collector 2 (shown in FIGS. 1 & 2), disposed along portions of an edge thereof. The collector may be made of any conductive material known to those ordinarily skilled in the art, and is coupled to output line 3b, shown as a single line from the side. Further shown is input line 3a from control circuit 30, attached to magneto resistor 1, at the end opposite to that of output line 3b.

Note that no insulation is shown between sensor 7 and ferromagnetic bit 6, since no electrical potential exists between them in this configuration. This can be an advantage in that the sensor and bit are more intimately related than if there were insulation separating them, which makes for greater electrical sensitivity of the cell. Finally, substrate 22 and memory cell 110 may be fabricated by any method known to those skilled in the relevant art, such as electroplating, sputtering, E-beam deposition, chemical vapor deposition, micro-machining, nano-technology and molecular beam epitaxy.

Method of Operation

In operation, and referring to FIG. 3, the first step is to write logical values into each bit 6. Specifically, read/write circuitry 30 and write circuit 31 are respectively activated for each memory cell. Uniquely, depending upon the direction of the current flow through write line 13, a logical "zero" or "one" is stored in the specific bit. Advantageously, unlike prior art designs, the complete memory array can be disconnected from the power or turned off at this time and all of the digital data stored in the array will be preserved. Where, previous memory designs must constantly be refreshed to maintain the digital data stored therein. Thus, this invention will save power over prior art designs.

To read the digital data in the present invention, the same read/write circuitry 30 is activated along with the appropriate read circuitry 12. Specifically, current is routed to sense circuitry 7. Current, as it enters from line 3a, will be mostly directed either toward collector 2, or away from it, dependent upon the remnant polarity of the adjoining bit 6. Amplifier 12 will sense the presence and amount of current which is allowed to pass into sense line 4, which will indicate that a logical "zero" or "one" was stored in the associated bit.

It is notable that a logical "one" or "zero" can be assigned to either a large amount of current present in sense line 4, or a small amount of current in sense line 4, as desired. Thus in one embodiment of the invention an amount of current in sense line 4, indicating a logical "one" is larger than an amount indicating a logical "zero," and in another embodiment, an amount of current in sense line 4, indicating a logical "zero" is larger than an amount indicating a logical "one."

Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function, manner of operation, assembly, and use may be made without departing from the principles and concepts set forth herein.

For example, insulation layer 22 may be eliminated in some circumstances. The exact alignment of parts, like input line 3a and output line 3b on magneto resistor 1, are not always essential and may work better if different positioning is encouraged.

What is claimed is:

1. A ferromagnetic memory circuit having a plurality of memory cells, each of the memory cells comprising:
   a) a bit, made of a ferromagnetic material, having a remnant polarity;
   b) a write line, located proximate the bit, coupled to receive a current sufficient to create the remnant polarity of the bit;
   c) a magneto sensor, positioned proximate the bit, including:
      1) a magneto resistor, having a current flow direction responsive to the remnant polarity of the bit;
      2) an input line, coupled to the magneto resistor to feed current to the magneto resistor;
      3) a single output line, coupled to the magneto resistor to receive current from the magneto resistor; and
      4) a single collector, coupled to both the output line and the magneto resistor, along a side of the magneto resistor between the output line and the input line, to collect current from the magneto resistor and conduct the current into the output line.

2. The memory circuit of claim 1, further comprising:
   a control circuit, electrically coupled to the write line and the magneto sensor, to provide separate current during the write and read operations.

3. The memory circuit of claim 1, further comprising:
   a) a sense line, coupled to the output line, which transfers current away from the collector; and
   b) a current amplifier, coupled to the sense line, to amplify and detect the presence and amount of current in the sense line.

4. The memory circuit of claim 2, wherein the control circuit further comprises:
   a) a read/write drive circuit, coupled to pass current into the write line in a first direction, and to pass current into the magneto resistor; and
   b) a read/write switch, coupled between the read/write drive circuit and the write line and the magneto resistor, designed to control which bit is activated during both writing and reading operations.

5. The memory circuit of claim 4, wherein the read/write switch is a transistor.

6. The memory circuit of claim 4, wherein current is directed across the magneto resistor by the control circuit when the differential amplifier is activated.

7. The memory circuit of claim 4, further comprising a write drive circuit, coupled to the write line to pass current to the write line in a second direction.

8. The memory circuit of claim 7, wherein the current is directed through the write line in either the first or second direction when control circuit and the write drive circuit are activated simultaneously.

9. The memory circuit of claim 1, wherein the input line is respectively coupled to the magneto resistor at an end opposite to an end where the output line is coupled to the magneto resistor.

10. The memory circuit of claim 1, further comprising a base, oriented in a horizontal plane, wherein the bit has a height that is oriented perpendicular to the horizontal plane of the base.

11. The memory circuit of claim 10, wherein the write line circumscribes proximate a periphery of the bit.

12. The memory circuit of claim 10, wherein the magneto sensor is placed below the bit in a substrate upon which the bit is disposed.

13. The memory circuit of claim 10, wherein the magneto sensor is placed above the bit.

14. The memory cell of claim 3, wherein a digital value of "1" is signified by an amount of current in the sense line between the bit and the amplifier which is greater than an amount of current present which signifies a digital "0."

15. The memory cell of claim 3, wherein a digital value of "0" is signified by an amount of current in the sense line between the bit and the amplifier which is greater than an amount of current present which signifies a digital "1."

* * * * *